(12) United States Patent
Hernandez

(10) Patent No.: US 6,441,701 B1
(45) Date of Patent: Aug. 27, 2002

(54) TUNABLE BRIDGED-T FILTER

(75) Inventor: Gilberto J. Hernandez, Miami, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/405,099

(22) Filed: Sep. 22, 1999

(51) Int. Cl.[7] .............................. H03H 7/01; H03H 7/07
(52) U.S. Cl. ...................... 333/171; 333/174; 333/175
(58) Field of Search .............................. 333/171, 174, 333/175, 170, 176

(56) References Cited

U.S. PATENT DOCUMENTS

| | | | | |
|---|---|---|---|---|
| 1,632,814 A | * | 6/1927 | Zinn | 333/170 |
| 1,647,634 A | * | 11/1927 | Johnson | 333/170 |
| 3,533,020 A | * | 10/1970 | Hecht | 333/17.1 |
| 3,569,846 A | * | 3/1971 | Matsuura | 329/339 |
| 5,148,133 A | * | 9/1992 | Zennamo, Jr. et al. | 333/175 |
| 5,576,756 A | * | 11/1996 | Baty et al. | 348/192 |

OTHER PUBLICATIONS

Williams, Electronic Filter Design Handbook, 1981, McGraw–Hill, Inc., p. 5–19.*

* cited by examiner

*Primary Examiner*—Justin P. Bettendorf
*Assistant Examiner*—Stephen E. Jones
(74) *Attorney, Agent, or Firm*—Scott M. Garrett

(57) ABSTRACT

A tunable filter (300) includes first (302) and second (304) "bridged-T" resonators. The first (302) and second (304) resonators are capacitively coupled together via bandwidth control/coupling section (306). A biasing section (314) provides the proper biasing and decoupling for the filter (300). Filter (300) provides for low-side injection mode operation, and provides for a very deep zero on the lower side of the passband resulting in excellent selectivity. Filter (300) provides for excellent selectivity while reducing the number of inductors and varactors needed in the filter circuit. A high side injection mode filter (500) similar to filter (300) is also described in the disclosure.

8 Claims, 7 Drawing Sheets

TUNABLE BRIDGED-T FILTER

TECHNICAL FIELD

This invention relates in general to electrical circuits, and more specifically to a tunable filter.

BACKGROUND

One or more filters, usually in the form of pass-band filters provide the front-end selectivity for a radio receiver. Such filters either are designed to have fixed bandwidths or they may have tunable bandwidths. Tunable bandwidth filters are usually used in wideband receivers where the operational frequency range is large. Most tunable filters use varactors as the tuning element. Each resonator element in the filter includes one or more varactors that in response to a control voltage provides the tuning mechanism for the filter. By varying the control voltage, the filter may be tuned to provide a narrow bandwidth for a desired frequency of operation.

In FIG. 1 there is shown a prior art receiver 100. An antenna 102 is used to receive radio frequency (RF) signals which are sent to a first filter also known as a pre-selector 104. The main function of filter 104 is to limit the bandwidth of the spectrum reaching the radio frequency amplifier 106 in order to minimize IM distortion and to attenuate the receiver spurious responses (e.g., image, ½ intermediate frequency (IF), etc.). The typical selectivity for filter 104 is in the range of 35–40 dB. As such, if a high selectivity receiver is required, a second filter stage 108 is used to provide for another 35–40 dB of selectivity.

As is done in conventional receivers, the filtered signal is then multiplied by mixer 110 with a local oscillator (LO) signal 112. The result of this multiplication process is a pair of output intermediate frequencies (IFs) 114 that are the sum and difference of the signal and LO frequencies. One of these IFs 114 is selected as the desired IF which is then band-pass filtered and amplified (circuitry not shown). The amplified signal is then sent through a second mixer or detector which translates the IF signal to baseband (audio) where it is further amplified and filtered prior to being presented to the user.

The main problem with the receiver 100 is that in order to achieve high selectivity, for example, over 90 dB at the image frequency, two or more filter stages 104 and 108 are needed. The use of multiple filter sections 104 and 108 adds to the overall cost of the receiver, since more components, shields, etc. are required. The cost of adding such extra filter sections is even higher in tunable filters given that tunable filters need to use expensive components such as varactors. Therefore, there exists a need for a tunable filter that can provide high selectivity while minimizing the cost of the filter.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
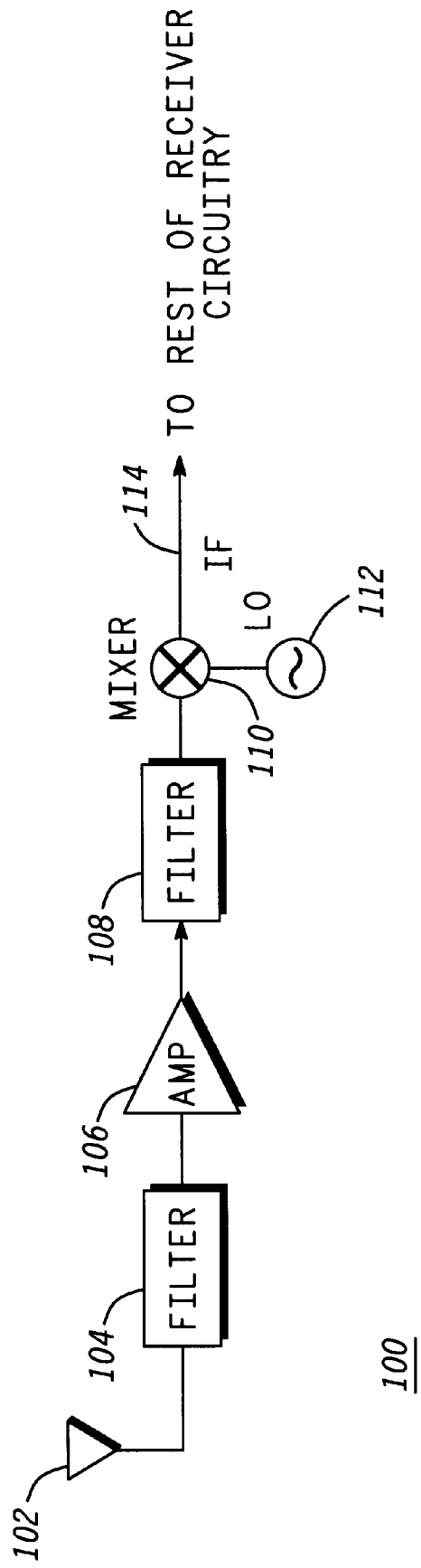
FIG. 1 is a block diagram of a prior art receiver.

While the specification concludes with claims defining the features of the invention that are regarded as novel, it is believed that the invention will be better understood from a consideration of the following description in conjunction with the drawing figures, in which like reference numerals are carried forward.

Figure 3:
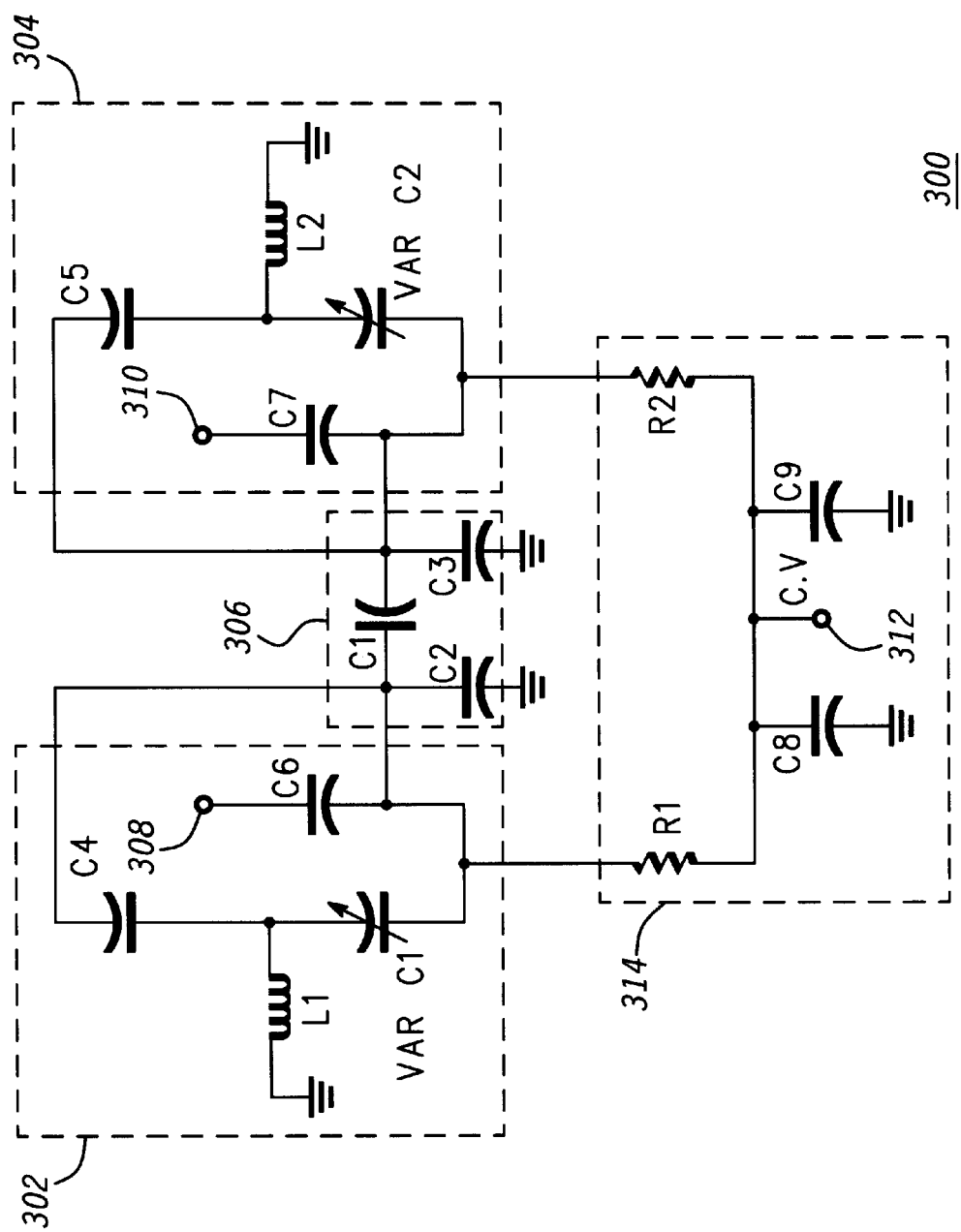
FIG. 3 is a schematic of a tunable filter in accordance with the present invention.

Referring now to FIG. 3, there is shown a tunable filter 300 corresponding to a ultra-high frequency (UHF) RF receiver front-end preselector for low-side injection mode operation capable of providing at least 100 dB of selectivity at the image frequency. The cost of the circuit is low since it requires a minimum number of expensive components like varactors and inductors, which typically are more costly than capacitors which make up for most of the proposed circuit.

The selectivity of the circuit is fairly independent of inductor quality factor, Q. This allows for more flexibility when choosing an inductor type for the circuit. And, it also makes the circuit an ideal candidate for integration. Selectivity of the circuit of FIG. 3 was measured with inductor Q's of 30, and 90. The selectivity of the filter was kept fairly constant for these inductor values, even though insertion loss was measured to be 1.5 dB with an inductor Q of 90, and degraded to 3 dB when a chip inductor with a Q of 30 was used.

The filter 300 is comprised of two resonating sections in a "bridged-T" form 302 and 304. The first bridged-T resonator section 302 includes an inductor L1 coupled to a varactor VAR-C1 and capacitor C4. A capacitor C6 is coupled to the other side of the varactor VAR-C1. An input port 308 is coupled to the other side of capacitor C6. The second bridged-T section 304 is identical to the first section 302. The second bridged-T resonator section 304 provides for an output port 310. In the preferred embodiment, both the input port 308 and the output port 310 are matched to 50 ohms.

The first resonator 302 and second resonator 304 are coupled by capacitors C1, C2 and C3 that form a coupling or bandwidth adjustment section 306. The three capacitors provide for a balanced coupling of the two resonator sections 302 and 304. The design of filter 300 provides for a very deep zero on the lower side of the frequency passband which can be set at the image frequency resulting in excellent attenuation of this spurious frequency. This particular zero tracks with the center frequency as the circuit is tuned over its frequency range. The deep zero is created by the "T" combination of circuit elements C4, VAR-C1, and L1 for resonance section 302 and C5, VAR-C2, and L2 for resonance circuit 304.

Capacitors C2 and C3 control the passband of the circuit making the 3 dB bandwidth wider or narrower. However, the position of the zero is not changed or altered. Capacitors C2 and C3 also control the poles of the circuit and, consequently, they offer control of the passband of the filter and this is quite useful when selecting a specific intermediate frequency (IF) to be used, without altering any other component value in the circuit.

Capacitors C4 and C5 track the zero with frequency. As the value of capacitors C4 and C5 decrease, the zero shifts up in frequency, and as the values of capacitors C4 and C5 increase, the zero shifts down in frequency. These components also shift the passband, but their presence in the filter 300 is more dominant in moving the zero than it is in moving the passband.

Biasing section 314 provides the necessary biasing for the filter and is comprised of resistors R1 and R2 and decoupling capacitors C8 and C9. A control voltage port 312 is provided and is used to provide a control voltage typically provided by the receiver's controller. Typically, the control voltage will vary between 0.5 volt and 4.5 volt, although this may change based on the particular design. By varying the control voltage, the filter 300 is tuned for a desired frequency of operation.

Figure 4:
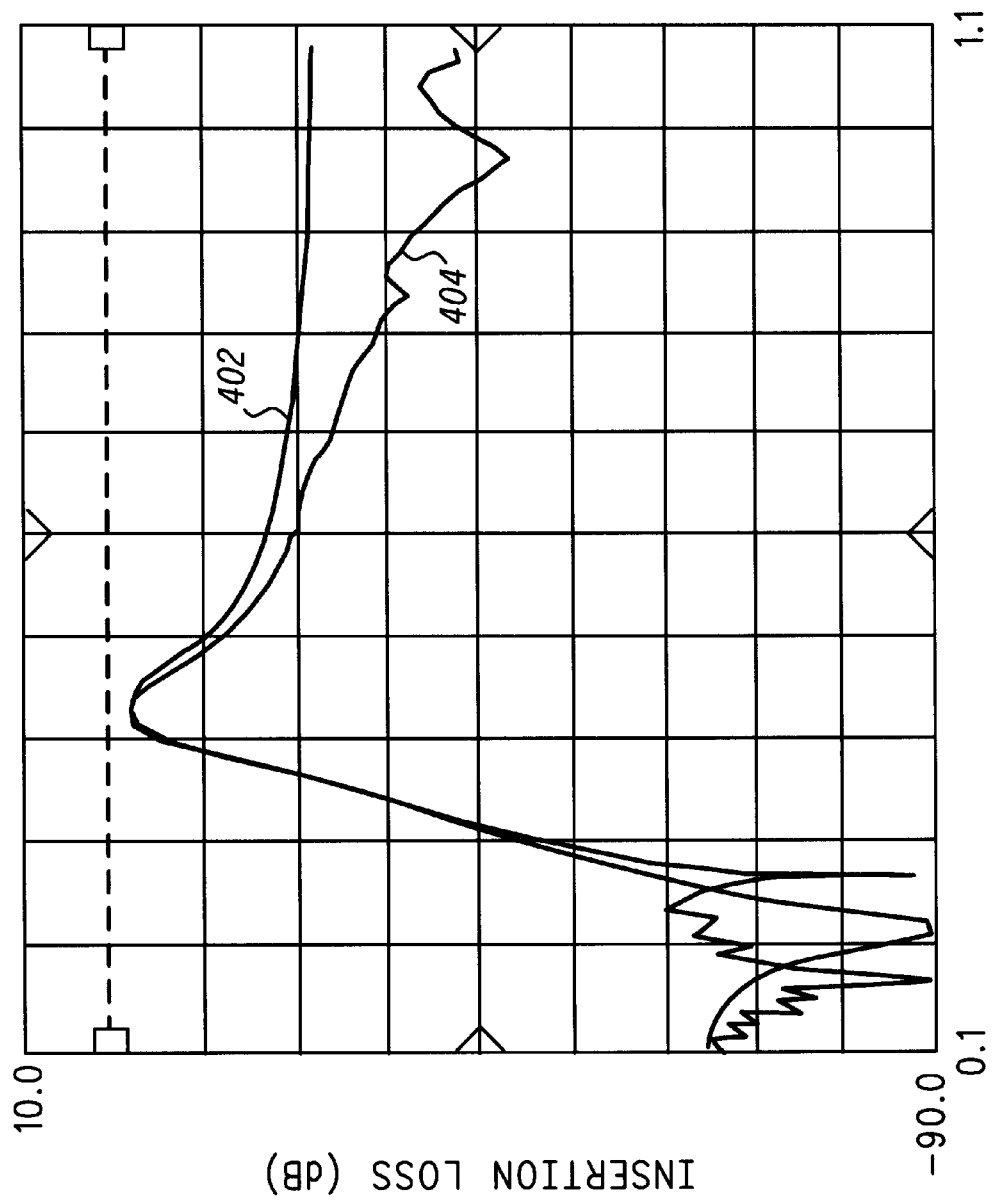
FIG. 4 shows the simulated and measured responses for the filter of FIG. 3.

The response produced by the filter 300 is easily shifted in frequency by changing the value of the shunted inductors L1 and L2. This is important since the filter response can easily be adapted to a specific frequency range without major efforts. The simulated response for the filter is shown by line 402 in FIG. 4, while the measured response is shown by line 404. The responses shown in FIG. 4 were taken using inductors having Q's equal to 30. Although the component values for filter 300 will vary depending on the particular filter characteristics desired, typical values for a UHF filter operating at around 400 MHz will be as follows: L1 and L2, 4.5 nH; C4, C6, C5 and C7, 10 pF; C2 and C3, 4.5 pF; C1, 8 pF; R1 and R2, 10 Kilo-ohm; C8, 150 pF; C9, 10,000 pF. Varactors Var-C1 and Var-C2 can comprise Toshiba 229's or other well known varactors used in the art.

The varactors used have a capacitance range of approximately 9–18 pF with 9 pF at a control voltage of 4.5 volt and a value of 18 pF at a control voltage of 0.5 volt.

Figure 5:
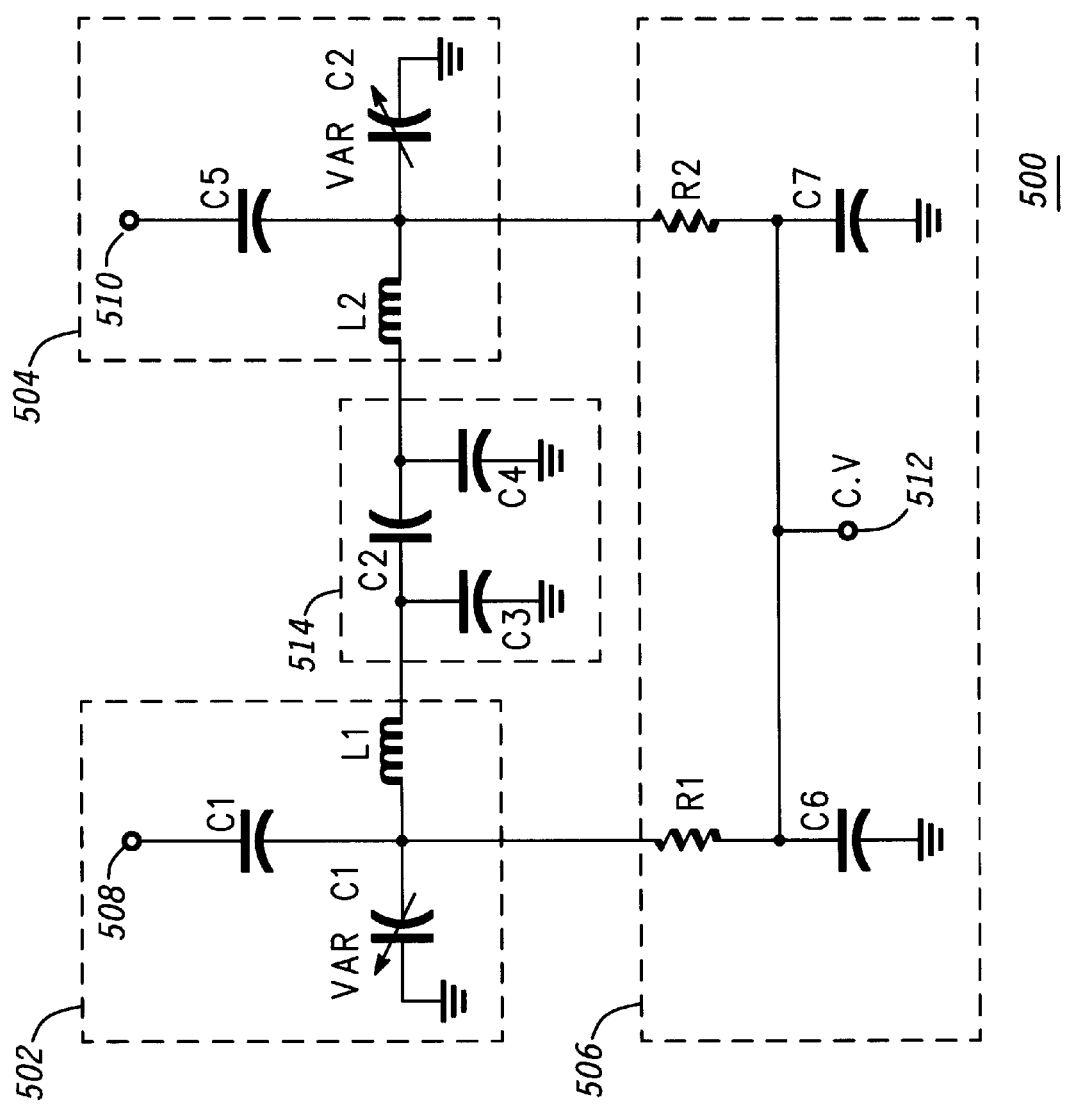
FIG. 5 shows another embodiment of a tunable filter in accordance with the present invention.

The filter design of FIG. 3 as mentioned above is designed for low side injection mode of operation (first local oscillator frequency is lower than the RF signal). However, the topology of FIG. 3 can be arranged, without changing the characteristics of the circuit, so that the deep zero is moved to the upper side of the response passband. Such a high-side injection mode UHF filter is shown in FIG. 5. Filter 500 shows a similar symmetrical circuit as shown in FIG. 3 using two "T" resonator sections or resonating networks 502 and 504 coupled together by a coupling or bandwidth adjustment section 514. Resonator 502 provides for a 50-ohm input port 508 and resonator 504 provides for a 50-ohm output port 504.

A biasing section 506 provides proper biasing for the filter. Decoupling elements C6 and C7 prevent DC voltage and RF signal from interfering with each other. A control port 512 receives a control voltage for tuning the filter 500. The bandwidth of the filter 500 is achieved and controlled with capacitors C2, C3 and C4. The 50 ohm point at the input 508 and output 510 of the filter 500 is taken between the tuning elements (e.g., varactors Var-C1 and Var-C2) and inductors L1 and L2 in each circuit section, respectively. This particular topology is useful for high side injection operation and provides excellent performance at a very low cost due to the limited number of costly components such as varactors and inductors.

Figure 6:
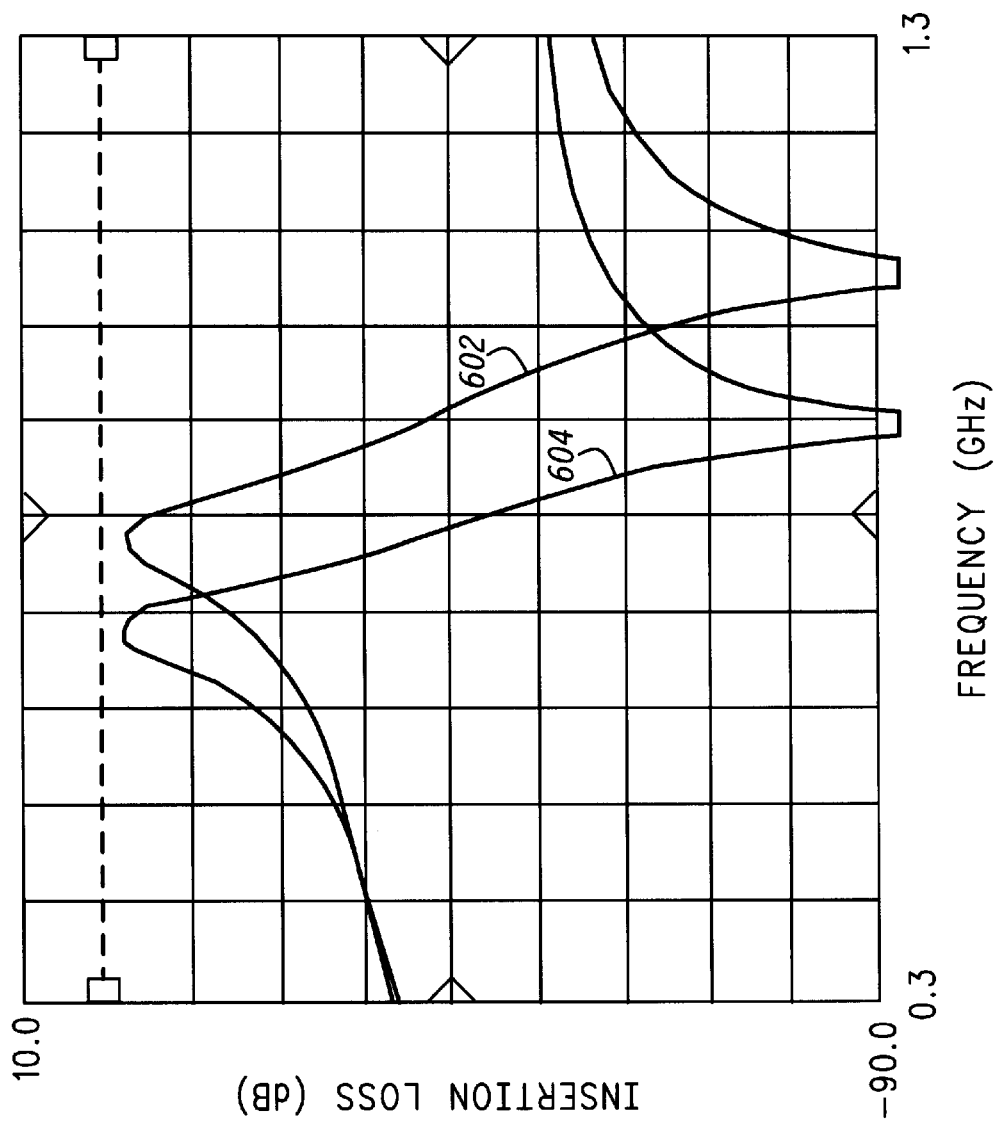
FIG. 6 shows the simulated and measured responses for the filter of FIG. 5.

The filter 500 is tunable and can easily be frequency shifted to a particular band, so it is not limited to a specific frequency range of operation. For example, the transfer function corresponding to this filter circuit is shown in FIG. 6. Line 602 and 604 show different simulated responses at different control voltages. An inductor value for L1 and L2 of approximately 2.5 nH was needed to move the response to the 700 MHz range as shown.

Figure 7:
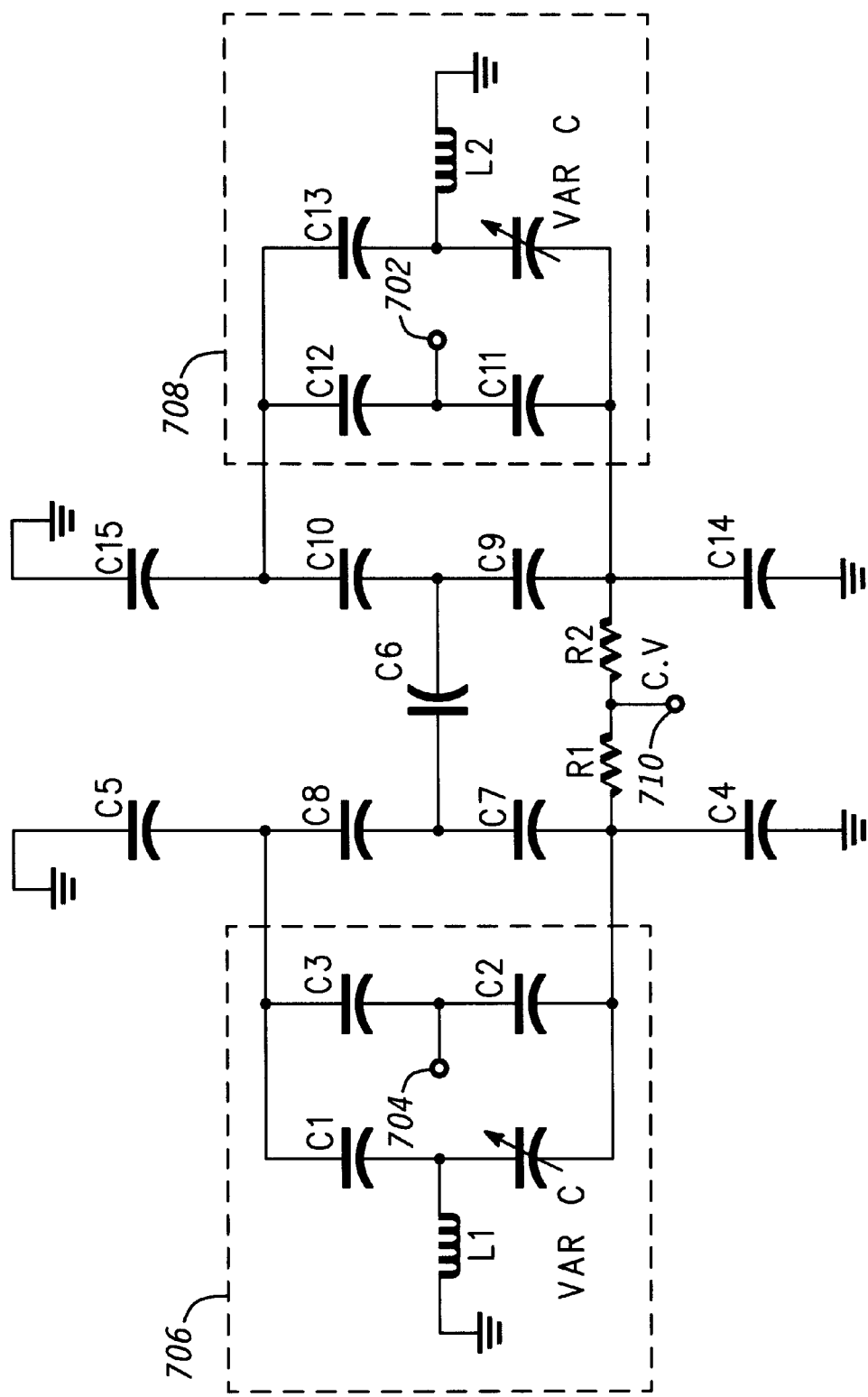
FIG. 7 is a schematic of another tunable filter embodiment in accordance with the present invention.

In FIG. 7 there is shown another low side injection filter 700 similar to that shown in FIG. 3 but using more components. Filter 700 has a quite useful two-pole bandpass transfer function that provides sufficient selectivity for most receiver front end radio architectures without the need of additional RF filtering to compensate for stringent design specification requirements. The filter 700 is tunable, and comprises several capacitors, two varactors and two inductors. The tunability like the previous filters discussed is achieved through the varactors.

Similar to the filter 300, filter 700 is comprised of two resonating sections in a "bridged-T" form coupled with capacitive elements. The coupling of the resonators is performed by capacitors C6, C7 and C8, C9 and C10. These five capacitors allow for a balanced coupling of the two resonator sections 706 and 708. An input port 704 is located in section 706 and an output port 702 is located in section 708. The resonator coupling arrangement of filter 700 permits for a more controlled, and easy to adjust bandwidth of the circuit. The drawbacks produced by this type of arrangement is that, first it minimizes the achievable tunability range of the circuit, and consequentially two additional varactors may have to be used in place of components C1 and C13 to cover an entire band like the UHF band. Secondly, the additional number of coupling components used of course increases the cost slightly as compared to filter 300.

Filter 700 presents a maximum output when the two resonating bridge-T like sections 706 and 708 are simultaneously tuned to the selected circuit resonance frequency.

Both the input 706 and output 708 are in the preferred embodiment matched to 50 ohms, and components C2 and C3 allow a good match at the input 704, and so does C11 and C12 at the output 702 of the filter 700. A control voltage input port 710 is provided between resistors R1 and R2.

Capacitor C6 by itself, without the need of capacitors C7, C8, C9 and C10, can perform the same bandwidth operation of the circuit, although adjusting the bandwidth with only C6 would become more difficult since the symmetry balance of the topology shown would be altered. With capacitor C6 left in the circuit as the single coupling element, eliminating capacitors C7, C8, C9 and C10 results in filter 300 shown in FIG. 3. By doing so, input matching capacitors C2 and C3 in filter 700 can be substituted by a single capacitor as is done in filter 300 since both capacitors C2 and C3 in filter 700 would be at the same potential. The same component reduction holds true for capacitors C11 and C12 at the output of filter 700, as well as capacitors C4 and C5 and C14 and C15 can be combined together so to reach the design of filter 300.

Figure 2:
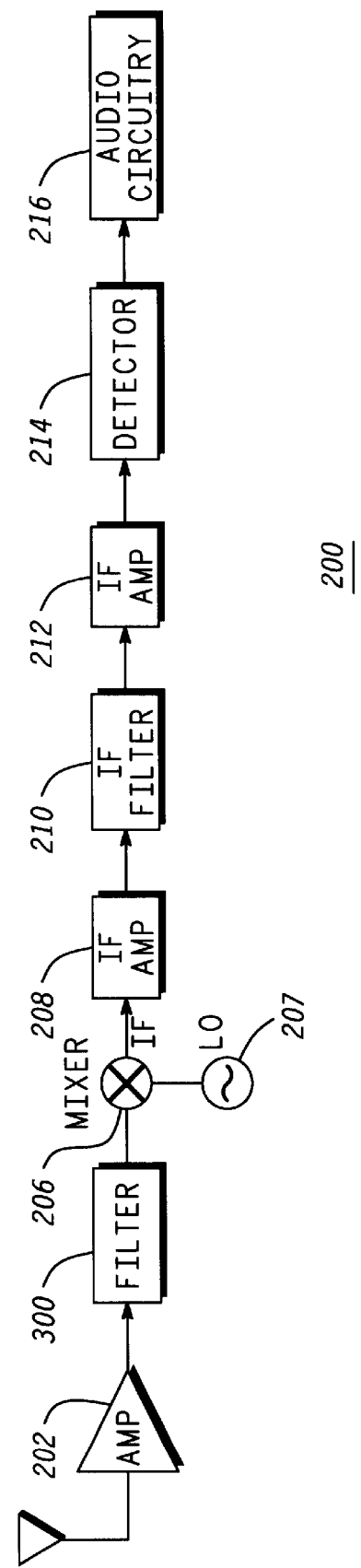
FIG. 2 is a block diagram of a receiver in accordance with the present invention.

Referring to FIG. 2, there is shown a receiver 200 in accordance with the present invention. Receiver 200 instead of using two filter sections as shown in FIG. 1 can get away with using one section thanks to the high selectivity achieved with filter section 300.

Although filter section 300 is shown on the output side of RF amplifier 202, it could also be coupled between the antenna and the input to RF amplifier 202 given the filter's high selectivity. The output of filter 300 is sent to mixer 206 which combines the filter's output with an LO signal produced by local oscillator 207. The IF signal produced by the mixer 206 is sent to an IF amplifier 208 for amplifying the signal and then to a IF filter 210 as is well known in the art. Typically, a second IF amplifier 212 is used prior to sending the signal to a detector circuit 214 which provides a base band signal to audio circuitry 216.

The present invention combines, in the low-side injection mode case (FIG. 3), a set of "bridged T" resonators 302 and 304 that are capacitively coupled to produce a two pole band pass filter 300 having a very deep zero on the lower section of the passband. This results in excellent selectivity using the least number of components and therefore provides for a high selectivity filter at a reduced parts cost. In the high side injection mode case, as shown in filter 500, a combination of elements forming a "T" network 502 and 504 coupled via a capacitive section 514 also produces a two pole band pass function with a very deep zero on the upper section of the passband that also results in excellent selectivity using a very small number of components.

The filters of the present invention not only provide selectivity in the 100 dB range, but because of the minimum use of varactors and inductors, provides for a filter which is fairly inexpensive to build and which is easier to integrate compared to other prior art filters.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A tunable filter, comprising:

first and second bridged-T resonator sections; and a coupling section that couples the first bridged-T resonator section to the second bridged-T resonator section;

wherein the first bridged-T resonator section comprises:

an input port;

a varactor having first and second terminals;

a first capacitor coupled between the input port and the first terminal of the varactor;

an inductor coupled between the second terminal of the varactor and a ground; and a second capacitor coupled between the second terminal of the varactor and the coupling section.

2. A tunable filter as defined in claim 1, wherein the coupling section comprises only capacitors.

3. A tunable filter as defined in claim 1, wherein the tunable filter operates in the low side injection mode.

4. A tunable filter as defined in claim 1, wherein the second bridged-T resonator section comprises:

an output port;

a varactor having first and second terminals;

a first capacitor coupled between the output port and the first terminal of the varactor;

an inductor coupled between the second terminal of the varactor and the ground; and a second capacitor coupled between the second terminal of the varactor and the coupling section.

5. A tunable filter as defined in claim 1, further comprising:

a biasing section coupled to the first and second bridged-T sections.

6. A tunable filter as defined in claim 5, wherein the biasing section further includes a control port for receiving a control voltage used for tuning the tunable filter.

7. A tunable filter as defined in claim 6, wherein the first and second bridged-T sections each includes at least one tunable element which is responsive to the control voltage.

8. A tunable filter as defined in claim 7, wherein the at least one tunable element in the first and second bridged-T sections comprise varactors.

* * * * *